US011112459B2

United States Patent
Qian et al.

(10) Patent No.: US 11,112,459 B2
(45) Date of Patent: Sep. 7, 2021

(54) SCAN BASED TEST DESIGN IN SERDES APPLICATIONS

(71) Applicant: Credo Technology Group Limited, Grand Cayman (KY)

(72) Inventors: Haoli Qian, Fremont, CA (US); Yifei Dai, Shanghai (CN); Ruiqing Sun, Shanghai (CN)

(73) Assignee: Credo Technology Group Ltd, Grand Cayman (KY)

( * ) Notice: Subject to any disclaimer, the term of this patent is extended or adjusted under 35 U.S.C. 154(b) by 356 days.

(21) Appl. No.: 16/022,989

(22) Filed: Jun. 29, 2018

(65) Prior Publication Data

US 2018/0306862 A1 Oct. 25, 2018

Related U.S. Application Data

(63) Continuation of application No. PCT/CN2016/082796, filed on May 20, 2016.

(51) Int. Cl.
*G01R 31/3185* (2006.01)

(52) U.S. Cl.
CPC ......... *G01R 31/318563* (2013.01); *G01R 31/318544* (2013.01); *G01R 31/318572* (2013.01)

(58) Field of Classification Search
CPC .... G01R 31/318544; G01R 31/318572; G01R 31/318563
See application file for complete search history.

(56) References Cited

U.S. PATENT DOCUMENTS

| 609,443 | A | | 8/1898 | Lewis | |
|---|---|---|---|---|---|
| 6,094,443 | A | * | 7/2000 | Dwork | G06F 7/02 370/510 |
| 6,748,564 | B1 | * | 6/2004 | Cullen | G01R 31/318547 714/728 |
| 6,944,729 | B2 | * | 9/2005 | Woodard | H03M 13/2782 711/154 |
| 7,888,955 | B2 | | 2/2011 | Berry | |

(Continued)

FOREIGN PATENT DOCUMENTS

| CN | 10650180 A | 8/2005 |
|---|---|---|
| CN | 103033741 | 4/2013 |

(Continued)

OTHER PUBLICATIONS

PCT International Search Report and Written Opinion, dated Feb. 3, 2017, Application No. PCT/CN2016/082796, "Scan Based Test Design in Serdes Applications," filed May 20, 2016, 11 pages.

(Continued)

*Primary Examiner* — Mischita L Henson
(74) *Attorney, Agent, or Firm* — Ramey and Schwaller LLP; Daniel J. Krueger (57) ABSTRACT

A method for testing operation of a device under test (DUT) includes receiving an input bit stream at an input pin, the input bit stream including multiplexed test patterns for a plurality of scan chains of the DUT. The method further includes demultiplexing the multiplexed test patterns, and providing a corresponding test pattern data to each of the plurality of scan chains. The method further includes, at each of the plurality of scan chains, scanning test results from the scan chain, to produce multiplex output test data into an output bit stream.

14 Claims, 5 Drawing Sheets

(56) References Cited

U.S. PATENT DOCUMENTS

| | | | |
|---|---|---|---|
| 2002/0101842 A1* | 8/2002 | Harrison | H04L 12/4633 370/338 |
| 2002/0120896 A1* | 8/2002 | Wang | G01R 31/318594 714/731 |
| 2003/0046623 A1* | 3/2003 | Khoche | G01R 31/318555 714/726 |
| 2004/0049723 A1 | 3/2004 | Obara | |
| 2005/0055618 A1 | 3/2005 | Finteis et al. | |

FOREIGN PATENT DOCUMENTS

| | | |
|---|---|---|
| CN | 103033741 A | 4/2013 |
| CN | 103366827 A | 10/2013 |
| CN | 105572573 A | 5/2016 |

OTHER PUBLICATIONS

IEEE Standard Test Access Port and Boundary-Scan Architecture, Sponsor: Test Technology Standards Committee of the IEEE Computer Society, Approved Jun. 14, 2001, The Institute of Electrical and Electronics Engineers, Inc. 3 Park Avenue, New York, NY 10016-5997, USA.
First Office Action in Chinese application No. 201680083103.6 dated Sep. 30, 2020.

\* cited by examiner

SCAN BASED TEST DESIGN IN SERDES APPLICATIONS

BACKGROUND

A system on a chip or "system on chip" (SoC) is a monolithic integrated circuit that includes all components of an electronic system, such as a computer. To verify that the components perform correctly and are free of defects, silicon automated test equipment (ATE) may be used to perform scan tests. During a scan test, one or more scan chains in the device under test (DUT) operate as shift registers to receive test pattern data from the ATE. The device components then operate on the test pattern data from the scan chain, producing test result data as output from the various components. One or more of the scan chains may capture the test result data, once again acting as a shift register to convey the test result data to the ATE. The ATE evaluates or in some fashion analyzes the test result data to determine whether the device performs correctly and/or is free of defects. For example, the test result data may be compared against a "target vector" of expected result data for the provided test pattern.

As the design of SoCs become more complex (e.g., to include more components), the number and/or length of scan chains increases, increasing the complexity of the testing process. For example, as the number of components increases, the number and length of test patterns may also increase, substantially increasing the volume of test pattern data that the ATE sends to the DUT and the volume of test result data that the ATE receives from the DUT. Digital I/O pins may be used to convey test data to and from the scan chains. In order to reduce the time required to perform the tests, one option may involve using a greater number of digital I/O pins. However, in large System-on-Chip (SoC) ASIC designs and implementations, a chip may be pin limited. Therefore, providing a greater number of digital I/O pins may not be feasible. Even if the number of input and output ports on the DUT is increased, the required testing time may still be undesirably lengthened.

SUMMARY

Accordingly, there are disclosed in the drawings and the following description test methods and systems employing serializer/deserializer (SerDes) ports on the DUT to receive and send test pattern and result data as bit streams of interleaved scan test data to and from multiple scan chains. An illustrative testing method embodiment includes: receiving an input bit stream via an input pin of a serializer/deserializer (SerDes) port of a device under test (DUT), the input bit stream including interleaved test patterns; demultiplexing the input bit stream to concurrently provide a de-interleaved test pattern to each of multiple scan chains in the DUT; processing the de-interleaved test patterns from the multiple scan chains to obtain test results that are stored by the multiple scan chains; multiplexing the test results from each of the multiple scan chains to provide an output bit stream having interleaved test results; and transmitting the output bit stream via an output pin of the SerDes port.

An illustrative integrated circuit device embodiment includes: an input pin and an output pin of a serializer/deserializer (SerDes) port; a test receiver; multiple scan chains; one or more logic components; and a test transmitter. The SerDes port receives an input bit stream via the input pin, the input bit stream including interleaved test patterns. The test receiver includes a demultiplexer that converts the interleaved test patterns into parallel, de-interleaved test patterns. The multiple scan chains each store a corresponding one of the de-interleaved test patterns. The logic components operate on the stored test patterns to produce vectors of test results stored by the multiple scan chains. The test transmitter transmits an output bit stream via the output pin, the test transmitter including a multiplexer that coverts parallel test result vectors into a payload of interleaved test results for the output bit stream.

The disclosed embodiments may optionally have one or more of the following additional elements in any suitable combination. 1. detecting a start frame delimiter in the input bit stream, wherein the start frame delimiter identifies a beginning of a test pattern data frame. 2. in response to said detecting, initializing a counter that coordinates said demultiplexing of the input bit stream. 3. the counter drives a selection input of a demultiplexer performing said demultiplexing. 4. interleaving the test results in a bitwise fashion to form a payload for a test result frame. 5. prepending pre-frame bits to the test results from each scan chain. 6. interleaving the pre-frame bits to form a start frame delimiter that indicates a beginning of the test result frame. 7. aligning a bit from each de-interleaved test pattern with a scan chain clock to provide N bits in parallel to N scan chains. 8. N is at least four. 9. the scan chain clock is at least 100 MHz. 10. the input bit stream conveys interleaved test patterns at a rate of at least 10 Gbits/sec. 11. a frame locker that detects a start frame delimiter in the input bit stream. 12. the frame locker initializes the counter in response to detecting the start frame delimiter. 13. the multiplexer interleaves the test results in a bitwise fashion to form the payload for a test result frame. 14. the transmitter prepends a start frame delimiter to the payload to indicate the beginning of the test result frame. 15. an alignment block that aligns bits from the de-interleaved test patterns with a scan chain clock to provide N bits in parallel to N scan chains.

It should be understood, however, that the specific embodiments given in the drawings and detailed description do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are test methods and systems conveying scan test data via SerDes ports. According to one embodiment, a method for testing operation of a device under test (DUT) includes receiving an input bit stream at a SerDes input pin, the input bit stream including interleaved test pattern data for a plurality of scan chains of the DUT. The method further includes demultiplexing the input bit stream, and providing a de-interleaved test pattern to each of the plurality of scan chains. The method further includes enabling components of the DUT to operate on the test pattern from each of the plurality of scan chains to produce test result data, which may be captured by the scan chains as test result data, and multiplexing the test result data from the plurality of scan chains to produce an output bit stream that is transmitted via a SerDes output pin.

In at least some embodiments, the DUT includes one or more SerDes ports to support high bandwidth serial communications, and may employ one of these SerDes ports to support communications between automated test equipment (ATE) and Joint Test Action Group (JTAG)-compliant test data receivers and transmitters. The test data receivers and transmitters provided by IEEE Std. 1149.6 are designed to perform boundary-scan testing, i.e., Joint Test Action Group (JTAG) testing. These test receivers and transmitters may be designed to perform the JTAG testing of primarily board-level features, e.g., whether integrated circuit chips are properly soldered on the board, whether electrical shorts are present, etc., and may thus have a relatively low bandwidth (e.g., on the order of 100 to 200 Mbit/s) deemed sufficient to facilitate boundary-scan testing at the board level. Where JTAG testing is desired for components of complex SoC devices, such testing may benefit from using available SerDes interfaces which are equipped to handle data speeds that are significantly higher than the IEEE Std. 1149.6 bandwidths. For example, SerDes speeds may range from 10 to 25 Gbits/sec, 50 Gbits/sec, or even more, enabling a single SerDes port to support communications with dozens or hundreds of IEEE Std. 1149.6 test receivers and transmitters, or more directly, to support communications with the scan chains that would otherwise be accessed via the JTAG-compliant test receivers and transmitters. The test pattern data for multiple such scan chains may be multiplexed and conveyed via a single SerDes input port, and similarly test result data from multiple such scan chains may be multiplexed and conveyed via a single SerDes output port. Accordingly, the number of I/O ports that is used to test multiple scan chains is reduced. In addition, because the SerDes ports offer faster speeds, the time that is required to perform the scan tests of multiple scan chains is reduced.

Figure 1:
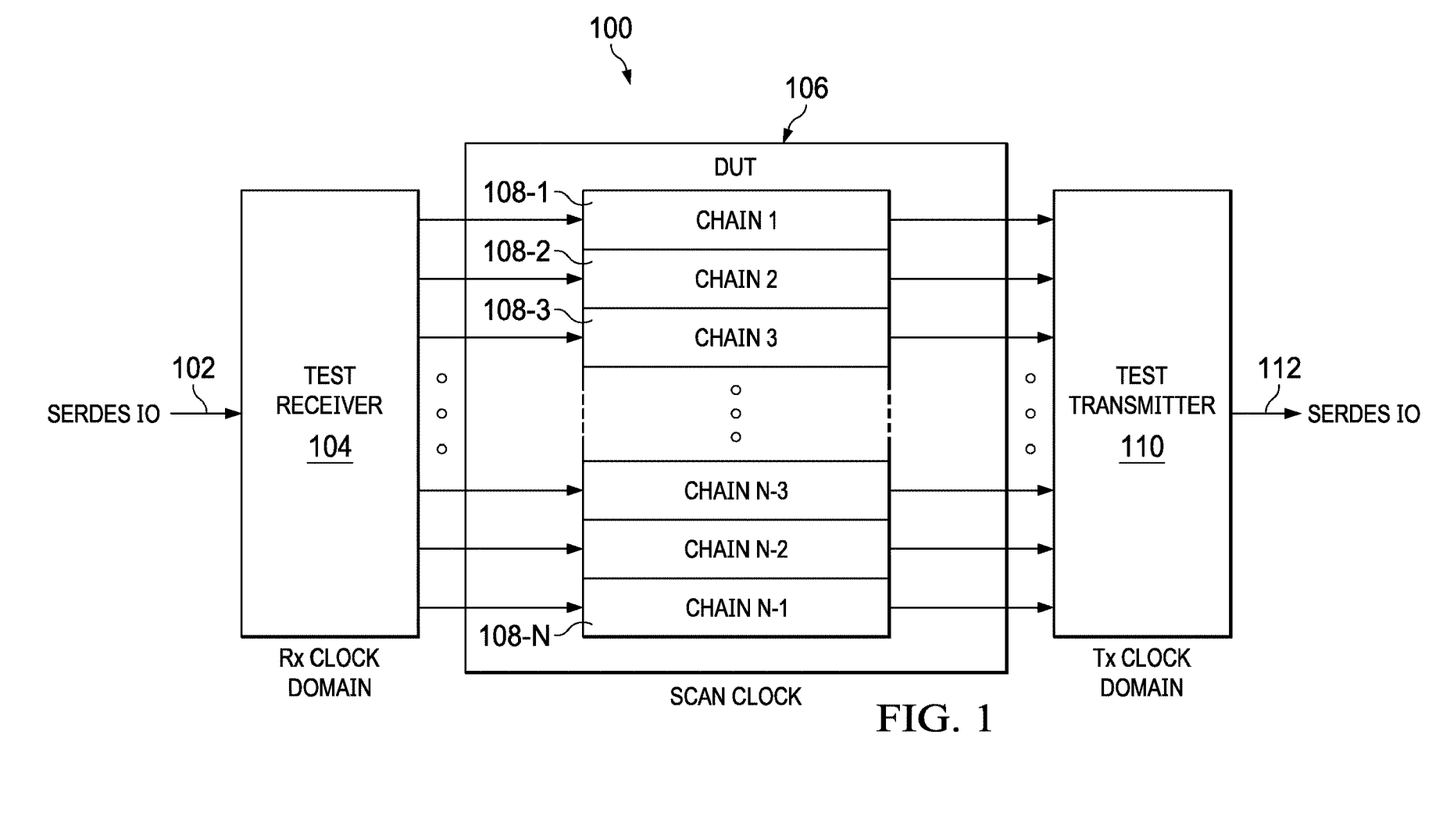
FIG. 1 is a block diagram of a system for performing scan tests according to one embodiment.

FIG. 1 is a block diagram 100 of a system for performing scan test according to at least one embodiment. With reference to FIG. 1, a serial input pin 102 and a serial output pin 112 are illustrated as functioning in a scan test mode. According to various embodiments, the pins 102 and 112 are SerDes port input and output pins. The serial input pin 102 is coupled to a test receiver 104, which is preferably configured to handle SerDes traffic (e.g., high-bandwidth traffic). The test receiver 104 is coupled to digital logic 108 (e.g., a device under test, or DUT) that is to be tested. The digital logic 108 includes multiple scan chains (e.g., scan chains 108-1, 108-2, 108-3, . . . , 108-N) that each accept test pattern data from the test receiver. The scan chains of the digital logic 106 are in turn coupled to a test transmitter 110, which accepts test result data from the scan chains, and which in turn is coupled to the serial output pin 112.

In operation during scan test mode, an automated tester device supplies an input bit stream to the serial input pin 102. The input bit stream includes multiplexed test pattern data for each of multiple scan chains (e.g., scan chains 108-1, 108-2, 108-3, . . . , 108-N). The test data is multiplexed in a manner such that the test pattern data is separable by the test receiver 104. The test receiver 104 demultiplexes the test pattern data, in order to provide the individual test patterns to their proper scan chains. In response to the test pattern data, the digital logic 108 produces test result data, which is captured by the scan chain. The test result data is provided to the test transmitter 110. The test transmitter 110 multiplexes the test result data and provides the multiplexed test result data to the serial output pin 112.

When not in scan test mode, the SerDes port may use serial input pin 102 and serial output pin 112 to receive and transmit SerDes traffic for a normal function of the device.

Figure 2:
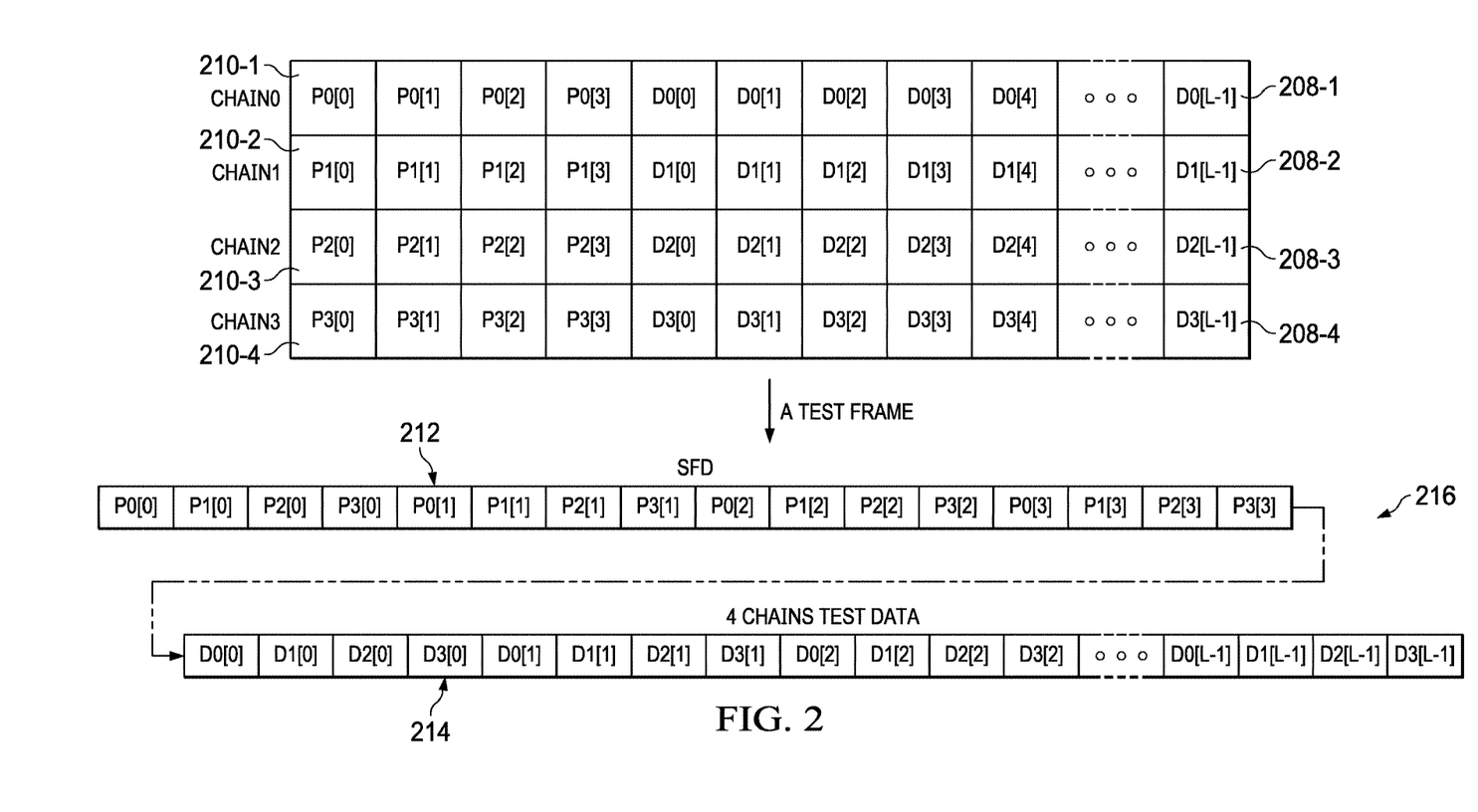
FIG. 2 illustrates an example of generating multiplexed test pattern data.

FIG. 2 illustrates an example of generating multiplexed test pattern data by interleaving the test patterns for different scan chains. In the example of FIG. 2, the multiplexed test pattern data is for interleaving test patterns for N=4 scan chains. However, it is understood that the number N may be larger or smaller.

The test pattern data includes scan chain test patterns 208-1, 208-2, 208-3, and 208-4. Test pattern 208-1 is provided for a first scan chain (e.g., scan chain 108-1), and is composed of L bits (D0[0], D0[1], D0[2], . . . , D0[L-1]). Test pattern 208-2 is provided for a second scan chain (e.g., scan chain 108-2), and is composed of L bits (D1[0], D1[1], D1[2], . . . , D1[L-1]). Test pattern 208-3 is provided for a third scan chain (e.g., scan chain 108-3), and is composed of L bits (D2[0], D2[1], D2[2], . . . , D2[L-1]). Test patterns 208-4 is provided for a fourth chain (e.g., scan chain 108-N, where N=4 in the example of FIG. 2), and is composed of L bits (D3[0], D3[1], D3[2], . . . , D3[L-1]).

To enable the test receiver 104 to unpack the test pattern data 208-1, 208-2, 208-3, and 208-4 from an input bit stream of multiplexed test patterns, the input bit stream may be structured as a set of one or more test pattern frames, each test pattern frame having pre-frame data that serves as a start frame delimiter ("SFD") suitable for detection by the test receiver and enabling the test receiver to determine timing for the de-interleaving process. In FIG. 2, the SFD includes pre-frame data 210-1, 210-2, 210-3, and 210-4. Pre-frame data 210-1 is provided for marking the beginning of the test pattern for the first chain (e.g., scan chain 108-1), and in this embodiment is composed of 4 bits (P0[0], P0[1], P0[2], P0[3]). Pre-frame data 210-2 is provided to mark the beginning of the test pattern for the second chain (e.g., scan chain 108-2), and is composed of 4 bits (P1[0], P1[1], P1[2], P1[3]). Pre-frame data 210-3 marks the test pattern beginning for the third chain (e.g., scan chain 108-3), and is composed of 4 bits (P2[0], P2[1], P2[2], P2[3]). Pre-frame data 210-4 is prepended to the test pattern for the fourth chain (e.g., scan chain 108-N, wherein N=4 in the example of FIG. 2), and is composed of 4 bits (P3[0], P3[1], P3[2], P3[3]).

With continued reference to FIG. 2, the pre-frame data is interleaved, and the test patterns are interleaved. The pre-frame data is interleaved to produce a SFD 212 for a test frame in the input bit stream. The SFD 212 begins with the bits P0[0], P1[0], P2[0], P3[0], P0[1], P1[1], . . . , and ends with the bits . . . P2[2], P3[2], P0[3], P1[3], P2[3], P3[3]. The test pattern data is interleaved to produce the test frame payload 214. The payload 214 begins with the bits D0[0], D1[0], D2[0], D3[0], D0[1], D1[1], . . . , and ends with the bits . . . D0[L-1], D1[L-1], D2[L-1], D3[L-1]. The SFD 212 and payload 214 are concatenated to produce a test frame 216 for the input bit stream.

With reference back to FIG. 1, during scan test mode, the test pattern frame 216 is included in the input bit stream provided via the serial input pin 102 to the test receiver 104. It is understood that the test pattern frame 216 as illustrated in FIG. 2 is but one example of a test data frame that may be used. Other test data frame structures (e.g., involving different interleaving and/or concatenation algorithms) may be used, provided that the test receiver 104 is able to properly detect and decode the test pattern frame to obtain the test patterns 208-1, 208-2, 208-3, and 208-4 from the input bit stream.

Figure 3:
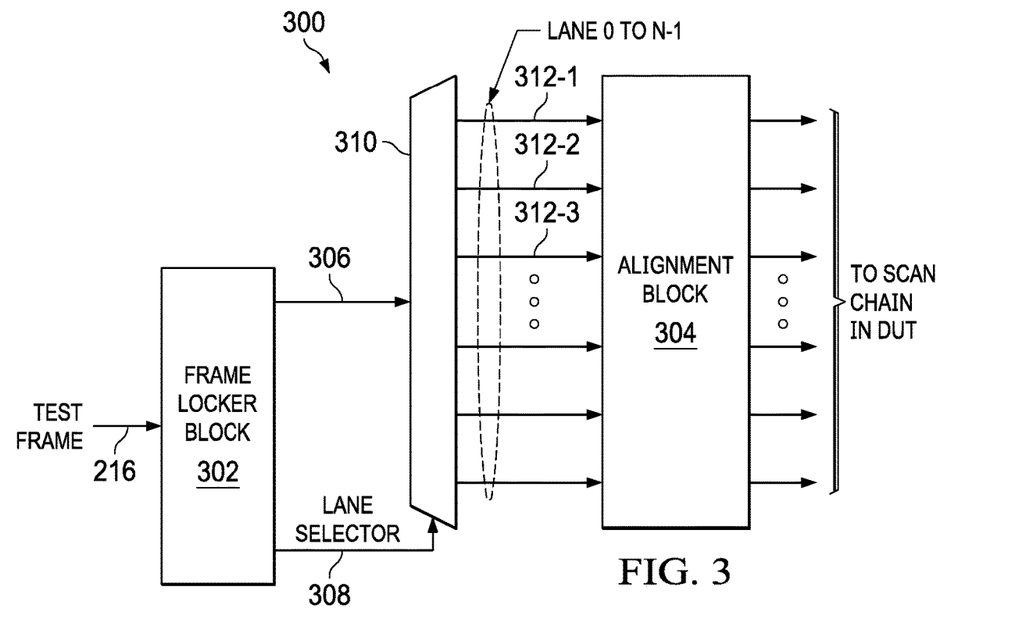
FIG. 3 is a block diagram of a test receiver according to one embodiment.

FIG. 3 is a block diagram 300 of the test receiver 104 according to one embodiment. The test receiver 104 includes a frame locker block 302, an alignment block 304, and a demultiplexer 310. In scan test mode, the test receiver 104 serves as a serial-in, parallel-out (SIPO) deserializer. In this regard, the test receiver 104 receives a serial bit stream including a test pattern frame 216, and outputs the test pattern data to the proper scan chains. For example, with reference to FIGS. 1 and 3, the test receiver 104 outputs test pattern 208-1 to scan chain 108-1, outputs test pattern 208-2 to scan chain 108-2, and so on.

As disclosed earlier with reference to FIG. 2, the test pattern frame 216 includes the SFD 212. When the test pattern frame 216 is input to the test receiver 104, the frame locker block 302 detects the SFD and, based thereon, "locks" the timing of the demultiplexer for the remainder of the test frame. In this regard, the frame locker block 302 recognizes the SFD as the header of a frame, and recognizes that the bits (e.g., payload 214) that follow the SFD correspond to test pattern data. Further, the frame locker block 302 outputs the payload 214 to the demultiplexer 310. In addition, the frame locker block 302 outputs the lane selector 308 to a control input (e.g., selection input) of the demultiplexer 310.

The lane selector 308 controls the demultiplexer 310 such that the test pattern data is directed to the proper scan chain (e.g., test pattern 208-1 to scan chain 108-1, test pattern 208-2 to scan chain 108-2, and so forth). Based on the interleaving illustrated in the example of FIG. 2, the lane selector 308 may be implemented as a 2-bit counter that is initialized and triggered by the SFD.

The counter serves as an index such that each bit of the test pattern data (e.g., payload 214) is sent to the correct scan chain (or lane). For example, when the value of the counter is equal to 0, the first bit of the payload 214 (D0[0]) is directed to a first lane 312-1. When the value of the counter is equal to 1, the next bit of the payload 214 (D1[0]) is directed to a second lane 312-2. When the value of the counter is equal to 2, the next bit of the payload 214 (D2[0]) is directed to a third lane 312-3. When the value of the counter is equal to 3, the next bit of the payload 214 (D3[0]) is directed to a fourth lane 312-4. When the 2-bit counter resets and is sequentially incremented, the next four bits of the payload are directed, in sequence, to the lanes 312-1, 312-2, 312-3, 312-4.

The alignment block 304 performs clock domain transfer operations. In scan test mode, the SerDes interface and the scan chain clocking operate according to different clock domains. For example, the SerDes interface may operate according to a clock having a frequency of $f_{SerDes}$, and preferably continues to operate at that frequency in the test mode. However, the transfer of test data to and from the scan chain may operate according to a clock having a frequency of $f_{scan}$. The $f_{SerDes}$ frequency is preferably equal to N times as the scan clock frequency $f_{scan}$, where N is the number of scan chains. The alignment block is implemented to bridge the clock domain boundary from test data receiver clock to scan clock domain, capturing and holding test pattern bits as needed to enable capture by the scan chains at the next transition of the $f_{scan}$ clock signal.

The alignment block 304 outputs the test pattern data in parallel to the proper scan chains of the DUT. It is understood that, in the course of running the scan tests, extra scan clock cycles may occur with no data transfer operations. These extra cycles account for time that is required for the test receiver 104 to perform the operations described earlier (e.g., locking the SFD and stripping (or shifting out) the SFD from the test frame 216). As such, the integrity of the payload is maintained.

In a normal JTAG testing fashion, the device logic 108 may be applied to the test patterns from the scan chain to generate test results. The scan chains may capture the test results as they are generated, and output the test result data to the test transmitter 110.

Figure 4:
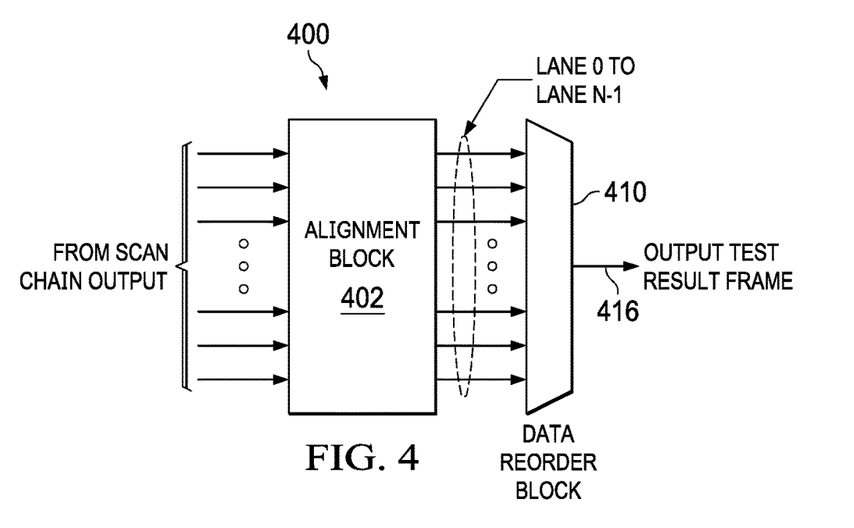
FIG. 4 is a block diagram of a test transmitter according to one embodiment.

FIG. 4 is a block diagram 400 of the test transmitter 110 according to one embodiment. The test transmitter includes an alignment block 402 and a data reorder block 404 (e.g., an interleaving multiplexer). The alignment block 402 receives the test result data from the DUT. The alignment block 402 bridges the clock domain boundary, holding bits as needed for them to be captured during the appropriate transitions of the SerDes transmitter clock. The alignment block 402 outputs the clock-aligned data in parallel to the data reorder block 404. The data reorder block 404 performs functions that are complementary to functions described earlier with reference to the demultiplexer 310. Further, the data reorder block 404 may prepend pre-frame data to the test result data from each scan chain, so as to form an SFD that precedes a payload in each test result frame 416 of the output bit stream. In test result frame 416, test results from N scan chains are interleaved and sent at the speed of $N*f_{scan}$. The generation of the test result frame 416 will now be described in more detail with reference to FIG. 5.

Figure 5:
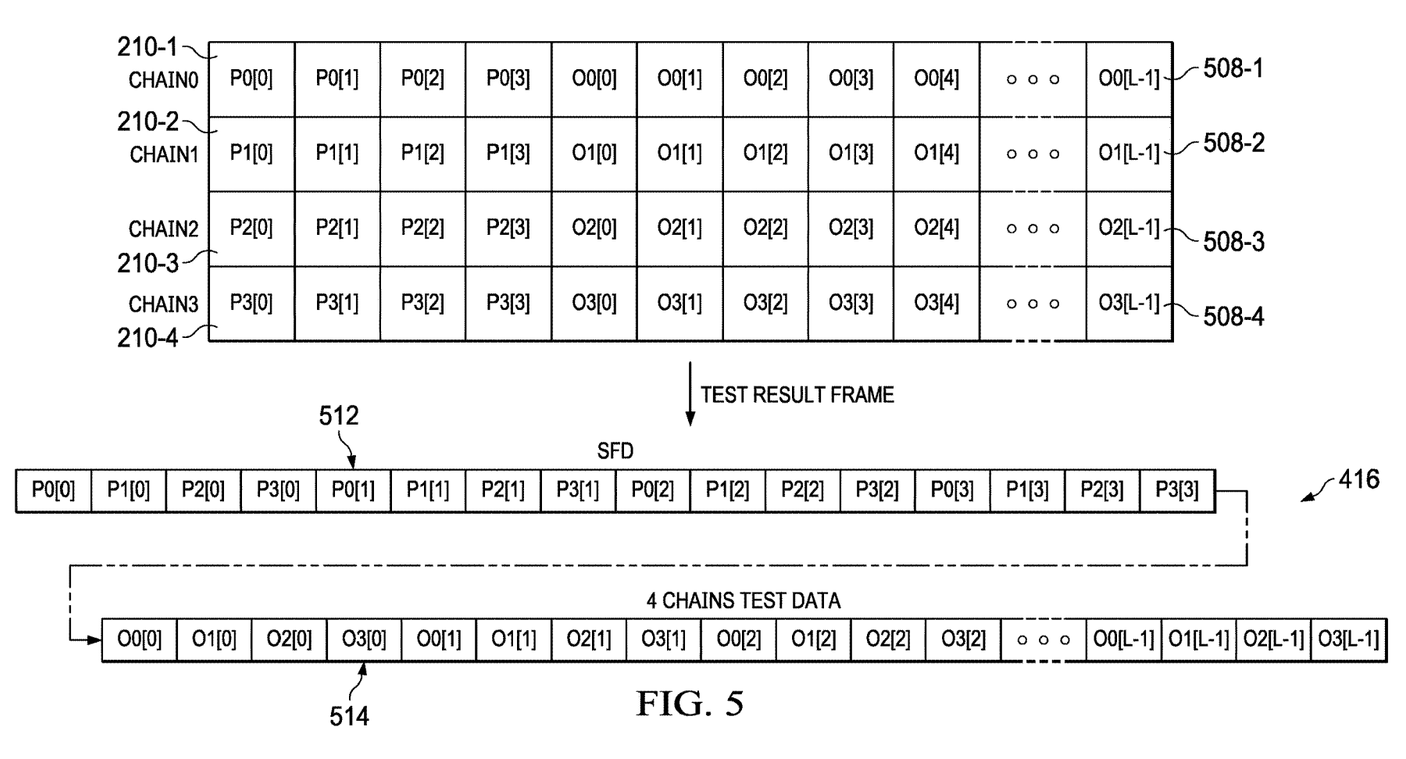
FIG. 5 illustrates an example of generating multiplexed test result data.

FIG. 5 illustrates an example of generating a test result frame having multiplexed test result data. In the example of FIG. 5, the multiplexed test result data is derived from the test results provided from N=4 scan chains. However, it is understood that the number N may be larger or smaller. The test result data includes test results 508-1, 508-2, 508-3, and 508-4. Test result 508-1 is a vector of test results captured by a first scan chain (e.g., scan chain 108-1), and is composed of L bits (O0[0], O0[1], O0[2], . . . , O0[L−1]). Test result 508-2 is a vector of test results produced via a second scan chain (e.g., scan chain 108-2), and is composed of L bits (O1[0], O1[1], O1[2], . . . , O1[L−1]). Test result 508-3 is produced by a third scan chain (e.g., scan chain 108-3), and is composed of L bits (O2[0], O2[1], O2[2], . . . , O2[L−1]). Test result 508-4 is produced by a fourth chain (e.g., scan chain 108-N, where N=4 in the example of FIG. 5), and is composed of L bits (O3[0], O3[1], O3[2], . . . , O3[L−1]).

To enable the automated test equipment to unpack the test results 508-1, 508-2, 508-3, and 508-4 from an output bit stream of one or more test result frames (e.g., test result frame 416), an SFD is provided. According to one embodiment, the SFD is formed from pre-frame data 210-1, 210-2, 210-3, and 210-4 described earlier with reference to FIG. 2, and prepended to each test result vector to mark the beginning of each.

With continued reference to FIG. 5, the pre-frame data is interleaved, and the test result vectors are interleaved. Similar to the interleaving described earlier with reference to FIG. 2, the pre-frame data is interleaved to produce an SFD 512. The SFD 512 begins with the bits P0[0], P1[0], P2[0], P3[0], P0[1], P1[1], . . . , and ends with the bits . . . P2[2], P3[2], P0[3], P1[3], P2[3], P3[3]. The test results from each scan chain are interleaved to produce a payload 514. The payload 514 begins with the bits O0[0], O1[0], O2[0], O3[0], O0[1], O1[1], . . . , and ends with the bits . . . O0[L−1], O1[L−1], O2[L−1], O3[L−1]. The SFD 512 and payload 514 are concatenated to produce a test result frame 416.

The test result frame 416 is output as part of a serial output bit stream being provided to the automated tester via the serial output pin 112. It is understood that the test result frame 416 as illustrated in FIG. 5 is but one example of an test data frame that may be used. Other form(s) of test data frames or differently-structured output bit stream (e.g., involving different interleaving and/or concatenation algorithms) may be used, provided that the automated test equipment is able to properly decode the output bit stream, and to unpack the test results 508-1, 508-2, 508-3, and 508-4 from the output bit stream.

When the automated test equipment receives the output bit stream, it is able to detect the SFD and lock the timing of the demultiplexing process for the duration of the payload. In this regard, another frame locker block 302 may recognize the SFD as the header of a frame, and recognize that the bits (e.g., payload 514) that follow the SFD correspond to test result data. The automated test equipment may then demultiplex the test result data. The demultiplexing may be performed in a manner similar to that described earlier with reference to the demultiplexer 310 of FIG. 3.

In any event, the test result data is evaluated (compared to expected test results) and potentially analyzed (to discern the cause of any mismatches) in order to determine whether the device 106 operates correctly and/or is free of defects. For example, the automated test equipment may compare each actual test result vector against a target result vector for each scan chain.

Figure 6:
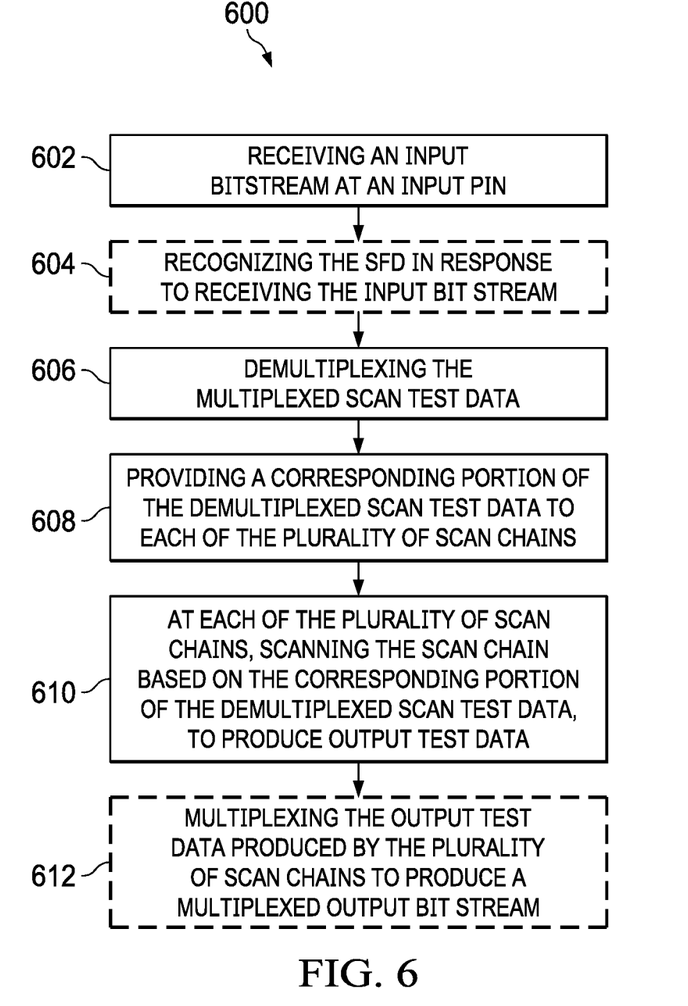
FIG. 6 is a flowchart showing an illustrative test method employing multiplexed scan test data.

FIG. 6 is a flowchart showing an illustrative testing method 600 employing SerDes communication of multiplexed test patterns. In the method 600, at block 602, an input bit stream is received at an input pin of a SerDes port of a DUT. The input bit stream includes multiplexed test patterns for a plurality of scan chains of the DUT. At block 604, an SFD also included in the input bit stream is recognized. At block 606, the multiplexed test pattern data is demultiplexed to obtain test patterns for each scan chain. At block 608, each scan chain is supplied with a corresponding test pattern. At block 610, at each of the plurality of scan chains, the scan chain data is processed by the corresponding DUT components to produce test result data, which the scan chains capture as it is produced. At block 612, the test result data is scanned out from the scan chains and multiplexed to produce a multiplexed test result frame in an output bit stream.

Numerous variations and modifications will become apparent to those skilled in the art once the above disclosure is fully appreciated. The methods and systems can be used for performing testing of and/or directing data in other devices, where pin availability may be limited. The ensuing claims are intended to cover such variations where applicable.

What is claimed is:

1. A testing method that comprises:
receiving an input bit stream via an input pin of a serializer/deserializer (SerDes) port of a device under test (DUT), the input bit stream including interleaved test patterns;
demultiplexing the input bit stream to concurrently provide a de-interleaved test pattern to each of multiple scan chains in the DUT;
processing the de-interleaved test patterns from the multiple scan chains to obtain test results that are stored by the multiple scan chains;
multiplexing the test results from each of the multiple scan chains to provide an output bit stream having interleaved test results, the multiplexing including:
prepending pre-frame bits to the test results from each scan chain;
interleaving the pre-frame bits to form a start frame delimiter that indicates a beginning of a test result frame; and
interleaving the test results in a bitwise fashion to form a payload for the test result frame; and
transmitting the output bit stream via an output pin of the SerDes port.

2. The testing method of claim 1, further comprising: detecting a start frame delimiter in the input bit stream, wherein the start frame delimiter identifies a beginning of a test pattern data frame.

3. The testing method of claim 2, further comprising: in response to said detecting, initializing a counter that coordinates said demultiplexing of the input bit stream.

4. The testing method of claim 3, wherein the counter drives a selection input of a demultiplexer performing said demultiplexing.

5. The testing method of claim 1, further comprising: aligning a bit from each de-interleaved test pattern with a scan chain clock to provide N bits in parallel to N scan chains.

6. The testing method of claim 5, wherein N is at least 4, and wherein the scan chain clock is at least 100 MHz.

7. The testing method of claim 1, wherein the input bit stream conveys interleaved test patterns at a rate of at least 10 Gbits/sec.

8. An integrated circuit device that comprises:
an input pin and an output pin of a serializer/deserializer (SerDes) port;
a test receiver that receives an input bit stream via the input pin, the input bit stream including interleaved test patterns, the test receiver including a demultiplexer that converts the interleaved test patterns into parallel, de-interleaved test patterns;
multiple scan chains that each store a corresponding one of the de-interleaved test patterns;
one or more components that operate on the stored test patterns to produce vectors of test results stored by the multiple scan chains; and
a test transmitter that transmits an output bit stream via the output pin, the test transmitter including a multiplexer that interleaves parallel test result vectors with prepended pre-frame bits into a test result frame having a start frame delimiter and a payload of interleaved test results for the output bit stream.

9. The device of claim 8, further comprising: a frame locker that detects a start frame delimiter in the input bit stream, wherein the start frame delimiter identifies a beginning of a test pattern data frame.

10. The device of claim 9, further comprising: a counter that coordinates operation of the demultiplexer, wherein the frame locker initializes the counter in response to detecting the start frame delimiter.

11. The device of claim 10, wherein the counter drives a selection input of the demultiplexer.

12. The device of claim 8, wherein the test receiver further comprises: an alignment block that aligns bits from the de-interleaved test patterns with a scan chain clock to provide N bits in parallel to N scan chains.

13. The device of claim 12, wherein N is at least 4, and wherein the scan chain clock is at least 100 MHz.

14. The device of claim 8, wherein the input bit stream conveys interleaved test patterns at a rate of at least 10 Gbits/sec.

* * * * *